United States Patent
Johnson et al.

(10) Patent No.: US 11,750,188 B2
(45) Date of Patent: Sep. 5, 2023

(54) OUTPUT DRIVER WITH STRENGTH MATCHED POWER GATING

(71) Applicant: Micron Technology, Inc., Boise, ID (US)

(72) Inventors: Bret Addison Johnson, Folsom, CA (US); Jung-Hwa Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 17/460,587

(22) Filed: Aug. 30, 2021

(65) Prior Publication Data

US 2023/0063891 A1    Mar. 2, 2023

(51) Int. Cl.
*H03K 17/687* (2006.01)
*G06F 1/28* (2006.01)
*G11C 11/407* (2006.01)

(52) U.S. Cl.
CPC .......... *H03K 17/6871* (2013.01); *G06F 1/28* (2013.01); *G11C 11/407* (2013.01)

(58) Field of Classification Search
CPC ...... G06F 1/28; G11C 11/407; H03K 17/6871
See application file for complete search history.

(56) References Cited

U.S. PATENT DOCUMENTS

| 2005/0024090 A1* | 2/2005 | Terletzki ........ H03K 19/018585 326/87 |
| 2005/0237094 A1 | 10/2005 | Stark et al. |
| 2014/0254286 A1 | 9/2014 | Bronner et al. |
| 2018/0190368 A1* | 7/2018 | Pan ........................ G11C 5/147 |

FOREIGN PATENT DOCUMENTS

KR           20210012558 A      2/2021

OTHER PUBLICATIONS

International Search Report And The Written Opinion For PCT Application No. PCT/US2022/035285, dated Oct. 17, 2022, 9 Pages.

* cited by examiner

*Primary Examiner* — Terrell S Johnson
(74) *Attorney, Agent, or Firm* — Fletcher Yoder, P.C.

(57) ABSTRACT

The systems and methods described herein consider a first channel width of transistors of driver circuitry, where the first channel width may be set to match a second channel width of a power control transistor. A control circuit, for example, may match a second channel width of a set of power control transistors to the first channel width by turning on one or more of the set of power control transistors. Matching the width of the switches of driver circuitry and the width of the set of power control transistors may reduce losses by helping to maintain impedances of the driver circuitry.

20 Claims, 9 Drawing Sheets

OUTPUT DRIVER WITH STRENGTH MATCHED POWER GATING

BACKGROUND

The present disclosure relates generally to memory devices and, more particularly, to systems and methods for matching transistor channel widths of output driver slices and a power control switch.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include an electronic device that, in operation, communicates information via electrical signals. For example, a computing system may include a processor communicatively coupled to a memory device, such as a dynamic random-access memory (DRAM) device disposed on a dual in-line memory module (DIMM). In this manner, the processor may communicate with the memory device, such as to retrieve executable instructions, retrieve data to be processed by the processor, and/or store data output from the processor.

When exchanging data between memory and the processor, the data may transmit via output drivers and/or input drivers. These driver circuits may be designed to have a particular impedance value, and there may be operational efficiencies or fewer losses when the impedance is maintained. Furthermore, a driver circuit may include multiple transistors divided amongst slices (e.g., respective subsets of the transistors) and one or more of the slices may be used for a particular data transmission. When not in use, a transistor may decouple the driver circuit from a supply voltage to reduce or stop a leakage current. However, when the driver circuit is in use, the switch may undesirably adjust the impedance, which may introduce losses or other operational inefficiencies.

BRIEF DESCRIPTION OF THE DRAWINGS

Various aspects of this disclosure may better be understood upon reading the following detailed description and upon reference to the drawings in which.

DETAILED DESCRIPTION

Figure 1:
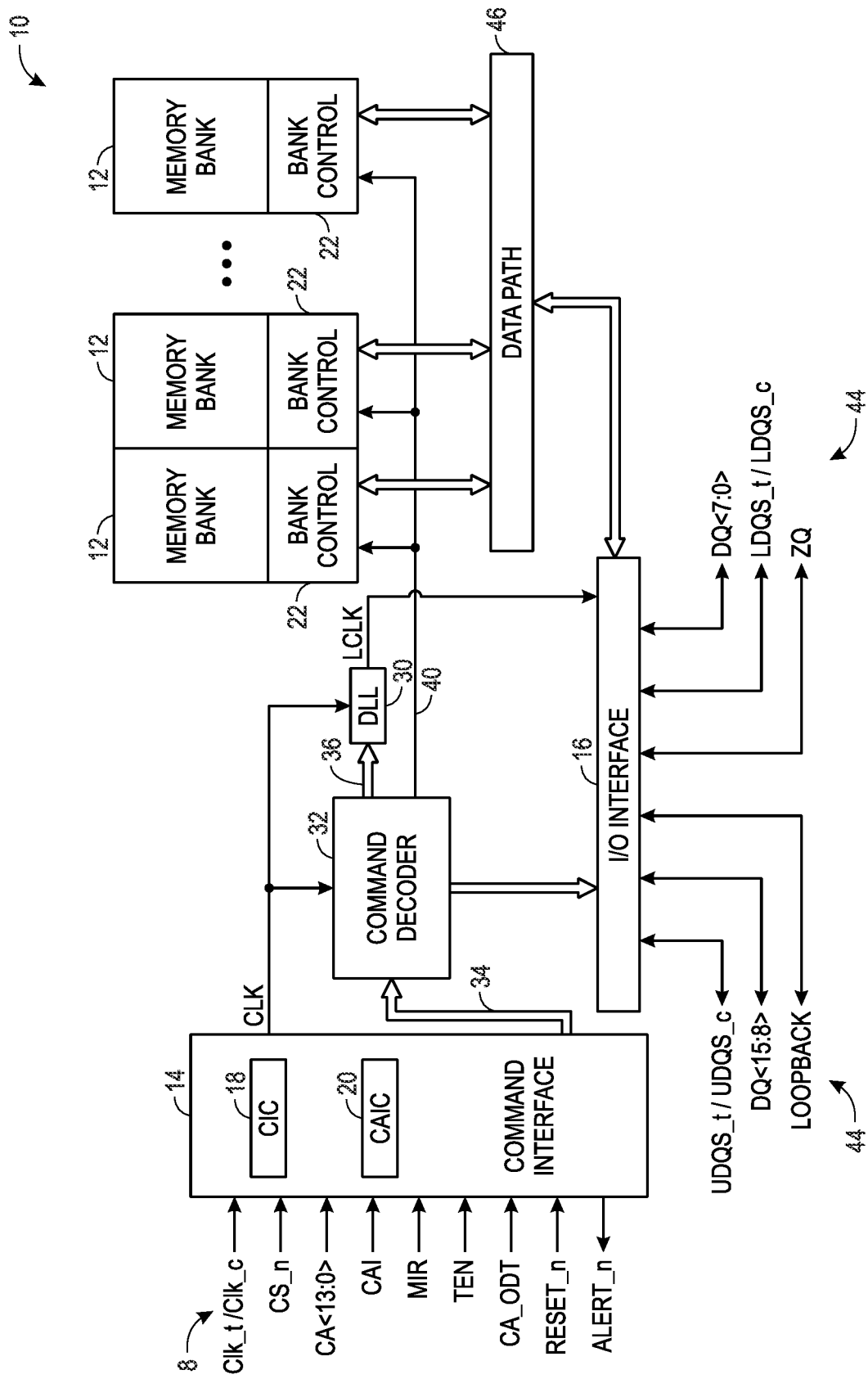
FIG. 1 is a block diagram of a memory device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, store data output from the processor, or any combination thereof.

Data transmitted between memory and the processor may transmit via an output driver designed to have a particular impedance value that, when maintained, helps to reduce losses in the computing system operation. The output driver may include transistors divided across different slices. When data is transmitted via the output driver, one or more of the slices may be used to transmit signals indicative together of a bit of data. For example, some of the slices are closed and used to transmit a same signal in parallel indicative of the bit of data.

Output drivers are composed of subparts of equal driving strength, referred to as slices. The number of slices to be used during data transmission is set by the computing system via configuration registers inside the memory device. The slices are connected in a parallel manner sharing power supplies and logically equivalent control connections except those determining the subselection of slices to be used.

The computing system may select the number of slices to balance data signal integrity (e.g., minimizing transmission losses or bit error rates (BER)) and power consumption of the system. In order to maintain signal integrity and minimize BER across multiple die in a computing system and across multiple computing systems the output driver should exhibit a consistent and predictable drive strength (or impedance) for a given number of slices selected by the system across variations of manufacturing process and operation environment variations of operating voltage and temperatures (PVT).

To maintain a consistent drive strength, the die contains calibration circuitry which determines control signal settings for a single slice to have a specified strength, intended to be accurate within 1-2% of a reference impedance usually connected externally to the die. All slices may receive the same calibration signals giving them identical electrical characteristics, and thereby making the output driver strength predictable to the system.

When not sending data, the slices may be open and the output driver may be idle. When in the open (or off) state the transistors of the output driver slices may still conduct some current due to sub-threshold leakage, which may be undesirable when non-negligible. The insertion of a power control transistor may be included to reduce current leakage experienced by decoupling the output driver from a one of the supply voltages while idle. However, the introduction of the power control transistor may undesirably adjust the impedance of the output driver from the desired impedance, even when the inserted power control transistor size is large. A large size is likely to be chosen to minimize its influence on the output driver's switching characteristics. To compensate for this effect in the impedance, the inserted power control transistor should be included or compensated for in the circuits responsible for the slice impedance calibration.

Operation of the computing system may improve when the power control transistor channel width is adjusted to the number of the active slices. Scaling the channel width of the power control transistor to the number of active slices may prevent or reduce a likelihood of the power control transistor adjusting output driver impedance, and thus ensures or increases a likelihood that an originally designed impedance is maintained.

To do so, the power control transistor may be replaced by multiple, smaller transistors that together have a channel width equaling that of the original power control transistor size when all slices are used. A power state control circuit may receive an indication of a number of slices to be used with a data transmission through the output driver. Based on the indication of the number of slices to be used, the power state control circuit may transmit power control signals to the power control switch to selectively close or open one or more transistors of the power control in response to slices being not activated for a data transmission. For example, the power state control circuit may use fewer transistors as fewer slices in the output driver are used to continue to match the channel width.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM may permit reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 8 from an external device (not depicted), such as a processor or controller. The processor or controller may provide various signals 8 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to permit proper handling of the signals 8. The command interface 14 may receive one or more clock signals from an external device. Generally, double data rate (DDR) memory utilizes a differential pair of system clock signals, referred to as the true clock signal (Clk_t) and the complementary clock signal (Clk_c). The positive clock edge for DDR refers to the point where the rising true clock signal (Clk_t) crosses the falling complementary clock signal (Clk_c), while the negative clock edge indicates that transition of the falling true clock signal (Clk_t) and the rising of the complementary clock signal (Clk_c). Commands (e.g., read command, write command, refresh command) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal (CLK). The internal clock signal (CLK) is supplied to an internal clock generator 30, such as a delay locked loop (DLL) circuit. The internal clock generator 30 generates a phase controlled internal locked clock signal (LCLK) based on the received internal clock signal (CLK). The phase controlled internal locked clock signal (LCLK) is supplied to the I/O interface 16, for instance, and is used as a timing signal for determining an output timing of read data.

The internal clock signal (CLK) may also be provided to various other components within the memory device 10 and may be used to generate various additional internal clock signals. For instance, the internal clock signal (CLK) may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal locked clock signal (LCLK). The phase controlled internal locked clock signal (LCLK) may be used to clock data through the I/O interface 16, for instance.

The command decoder 32 may decode commands, such as read commands, write commands, mode-register set commands, activate commands, or the like, and provide access to a particular memory bank 12 corresponding to the command via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other operations, such as timing control and data control, to facilitate the execution of commands to and from the memory banks 12. Collectively, the memory banks 12 and the bank control blocks 22 may be referred to as a memory array.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal causes the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on-die termination (CA ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals (CA<13:0>) on the command/address bus, for instance, depending on the command/address routing for the particular memory device 10. A mirror (MIR) signal may also be provided to facilitate a mirror function. The MIR signal may be used to multiplex signals so that they may be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses.

Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To permit higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS c; LDQS_t and LDQS c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and on-die termination (ODT) values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode where signals are looped back through the memory device 10 through the same pin. For instance, the loopback signal may be used to set the memory device 10 to test the data output of the memory device 10. Loopback may include both a data and a strobe, or possibly a data pin to provide the data and/or the strobe. This is generally intended to be used to monitor the data captured by the memory device 10 at the I/O interface 16.

Various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, or the like. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, a medical device, or the like. The terms used to describe these various examples of systems, like many of the other terms used herein, may share some referents and, as such, should not be construed narrowly in virtue of the other items listed.

Thus, the host device may generally be a processor-based device, which may include a processor, such as a microprocessor, that controls the processing of system functions and requests in the host device. Further, any host processor may include multiple processors that share system control. The host processor may be coupled directly or indirectly to additional system elements of the host device, such that the host processor controls the operation of the host device by executing instructions that may be stored within the host device or external to the host device.

As discussed above, data may be written to and read from the memory device 10, such as by the host device, whereby the memory device 10 operates as volatile memory, such as Double Data Rate DRAM (e.g., DDR5 SDRAM). The host device may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (S S D's), MultimediaMediaCards (MMC's), SecureDigital (SD) cards, CompactFlash (CF) cards, or any other suitable device. Further, it should be appreciated that the host device may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to permit a user to input data into the host device, such as by using buttons, switching elements, a keyboard, a light pen, a stylus, a mouse, and/or a voice recognition system. The host device may optionally also include an output device, such as a display coupled to the processor and a network interface device, such as a Network Interface Card (NIC), for interfacing with a network, such as the Internet. As will be appreciated, the host device may include many other components, depending on the application of the host device.

The host device may operate to transfer data to the memory device 10 for storage and may read data from the memory device 10 to perform various operations at the host device. Accordingly, to facilitate these data transmissions, in some embodiments, the I/O interface 16 may include a data transceiver that operates to receive and transmit DQ signals to and from the I/O interface 16.

At boundaries between physical chips and circuitry of a computing device, termination circuitry (e.g., on-die termination circuitry) may be used. This circuitry may include driver circuitry, such as an output driver. For example, an output driver may be used to transmit data from the memory banks 12 to the data path 46, from the data path 46 to the I/O interface 16, from the I/O interface 16 to downstream circuitry, or the like. At the output driver, a control system, such as the command decoder 32, may generate instructions to operate circuitry of the output driver to match an impedance of an input driver, a terminal, a data input, or the like, that it is coupled to at its output, which may reduce losses from an impedance mismatch.

Figure 2:
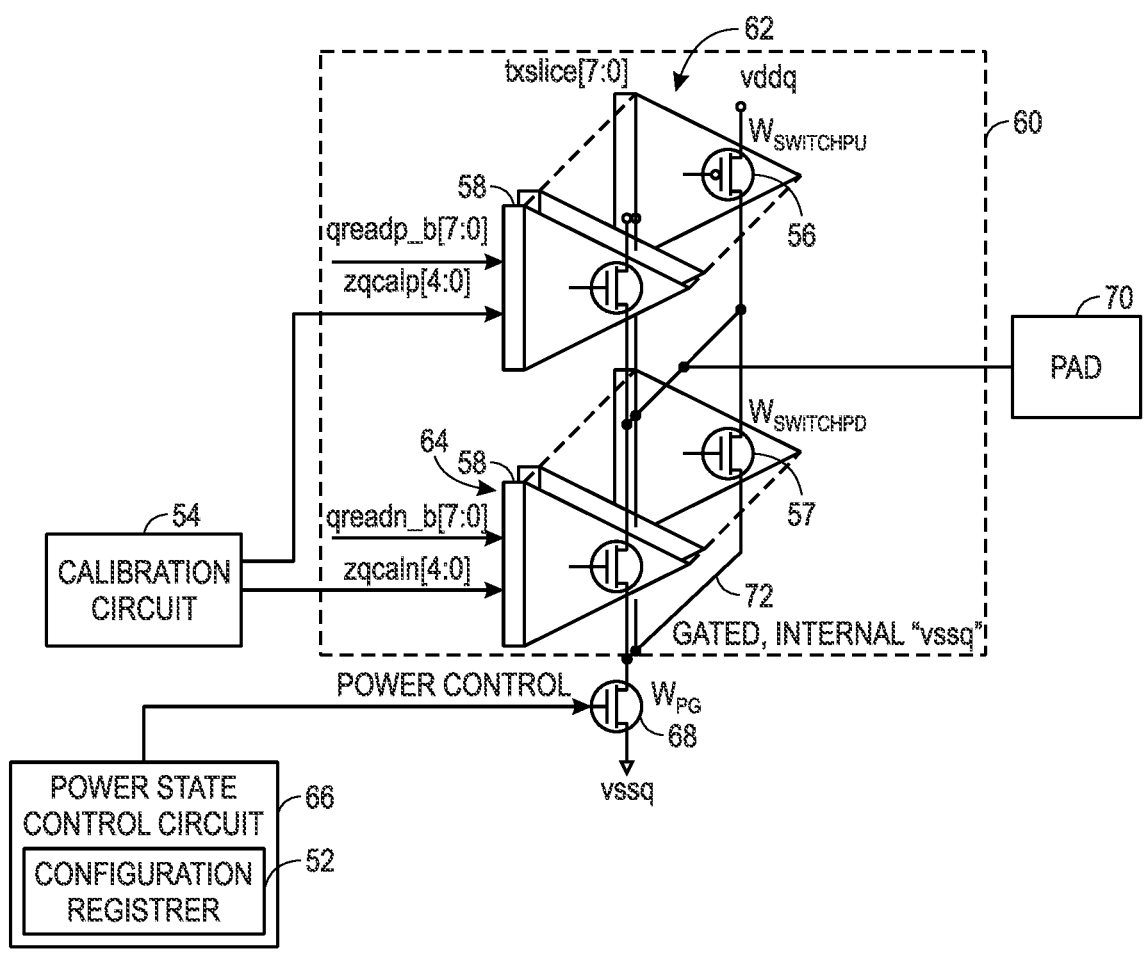
FIG. 2 is a circuit diagram of an output driver, in accordance with an embodiment.

To help illustrate, FIG. 2 is a circuit diagram of an example output driver 60. The output driver 60 includes 8 pull-up slices 62 and 8 pull-down slices 64 that include transistors 56, 57. A register may store indications of zqcalp [4:0] and zqcaln[4:0], such as a configuration register 52. The configuration register 52 may be located in any suitable portion of the computing device, and is shown here as part of a power state control circuit 66. A slice setting may control which of the qreadp_b[7:0] and qreadn_b[7:0] are transmitted. When each are transmitted, all eight signals may transmit a same voltage level to convey a logical high data bit. For example, the slices 62 may receive the qreadp_b [7:0] signals as gate signals and close in response to the signals. Each of the signals qreadp_b[7:0] or qreadn_b[7:0] may represent a same data bit and a number of signals of each used correspond to a number of slices 62, 64 indicated to be used. When turned on, one or more of the pull-up slices 62 and/or one or more of the pull-down slices 64 may electrically couple supply voltages (e.g., high supply voltage (VDDQ), low supply voltage (VSSQ)) to a pad 70. The pad 70 may be an input pad, an output pad, a data terminal, or the like, and may be coupled to downstream circuitry to receive data from the output buffer 60. It is noted that any combination of pull-up slices 62 and pull-down slices 64 may be activated at one time, and this combination may be set based on a type of memory device 10 communicating with the output driver 60.

Switching circuitry 58 may be included before the slices 62, 64. The switching circuitry 58 may include routing circuitry, wires, logic circuitry (e.g., AND gates, OR gates, not-AND gates, not-OR gates), or the like, to generate signals to transmit to each of the slices 62, 64, respectively, based on the zqcalp[4:0] signals and the qreadp_b[7:0] signals and based on the zqcaln[4:0] signals and the qreadn_b[7:0] signals. It is noted that the slices 62, 64 may include additional circuitry than the transistors 56, 57 that responds to a state of the signals transmitted from the switching circuitry 58, which is simplified for purposes of discussion to the slices 62, 64 shown in FIG. 2.

When the output driver 60 is idle, a power state control circuit 66 may decouple the output driver 60 from low supply voltage (VSSQ) by opening a transistor 68 via a power control signal. This decoupling may reduce an amount of power consumed by the idle output driver 60. The power state control circuit 66 may generate one or more control signals to close the transistor 68. However, when the output driver 60 is not idle, the transistor 68 may couple the low supply voltage (VSSQ) to the output driver 60. The transistor 68 may undesirably change an impedance of the output driver 60 if less than all of the slices 62, 64 are used due to, for example, transistor channel width mismatching.

For example, a total channel width across each transistor 57 (Wswitchpd) together across the slices 62 (e.g., Wswitchpd*N) may have a ratio matched to a channel width of the transistor 68 (Wpg). When one or more of the slices 62, 64 are not used, the channel widths of the transistors 56, 57 being used no longer together match the channel width of the transistor 68, which may change an impedance of the output buffer 60. As described above, there may be performance losses associated with not adjusting a channel width of the transistor 68 when adjusting a number of slices 62, 64. However, these losses may be prevented or mitigated by adjusting the channel width of the transistor 68 when changing the number of slices 62, 64. Indeed, a set of transistors may be used in place of the transistor 68. The set of transistors may be closed and/or opened to change a cumulative channel width to match that of the slices 62, 64 in response to the number of slices 62, 64 changing.

Figure 3:
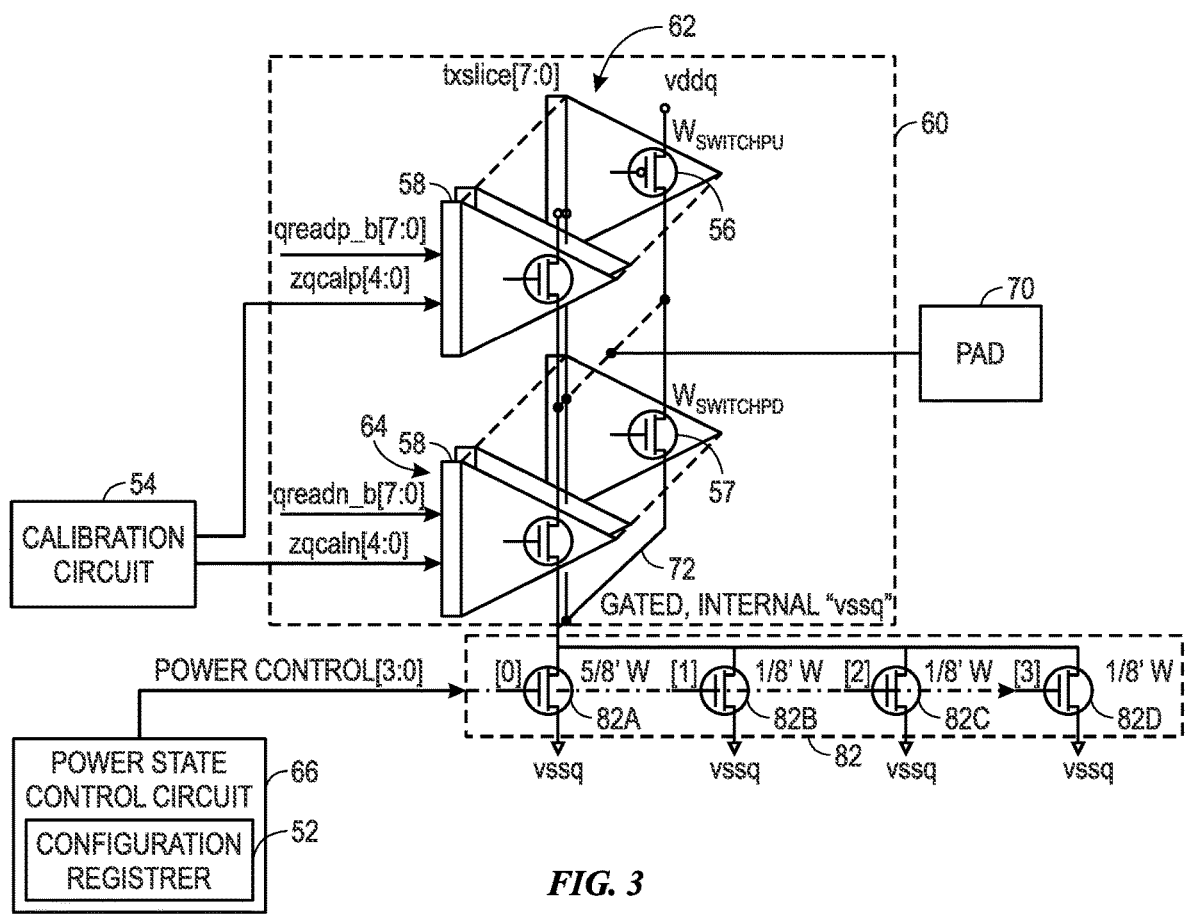
FIG. 3 is a circuit diagram of the output driver of FIG. 2 with a set of power control switches, in accordance with an embodiment.

To elaborate, FIG. 3 is a circuit diagram of the output driver 60 of FIG. 2 with a set of transistors 82 (transistor 82A, transistor 82B, transistor 82C, transistor 82D). The transistors 82 together have a channel width equal to that of the transistor 68 of FIG. 2 and individually have smaller channel widths to that of the transistor 68. For example, (⅝)W+(⅛)W+(⅛)W+(⅛)W equals or is substantially similar to Wpg. An overall channel width of the set of transistors 82 corresponds to a sum of the transistors 82 that are closed. For example, the transistor 82A may have a channel width equal to (⅝)*Wpg when just the transistor 82A is closed and may have a channel width equal to (⅖)*Wpg when both the transistor 82C and the transistor 82D are closed.

Similar to the power control signal of FIG. 2, the power state control circuit 66 may transmit one or more power control signals, power control[0:3], to selectively turn on one or more of the transistors 82. The power state control circuit 66 may close a number of the transistors 82 to match a channel width (e.g., within a threshold range of the channel width) of the transistors 57 closed. Each of the transistors 57 may have equal or different channel widths and the power state control circuit 66 may accordingly manage which of the transistors 82 are closed or open based on the different combinations of the channel widths.

The power state control circuit 66 may generate the power control[3:0] signals based on the configuration register 52. Indeed, a same parameter may be used to change which of transistors 82 are closed and which of the signals qreadn_b [7:0] and qreadp_b[7:0] are transmitted, and thus a number of the pull-up slices 62 and/or the pull-down slices 64 that are activated.

Figure 4:
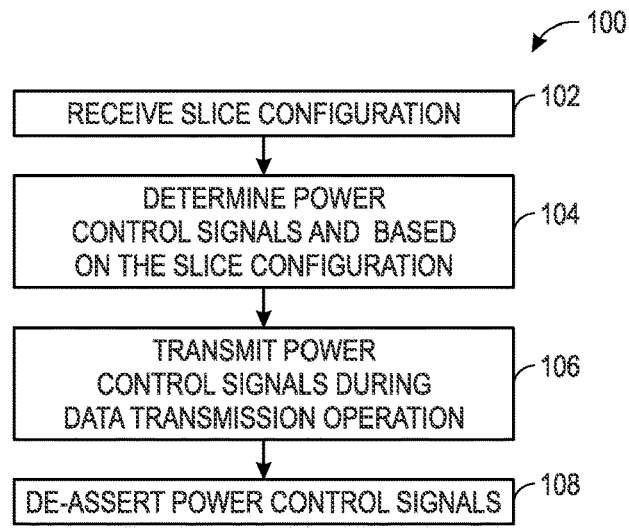
FIG. 4 is a process diagram of a method for adjusting a cumulative width of the set of power control switches of FIG. 3 to match a cumulative width of switches of the output driver of FIG. 3, in accordance with an embodiment.

Describing further methods of the power control circuit, FIG. 4 is a process diagram of a method 100 for adjusting a cumulative channel width of power control transistors 82 to match the cumulative channel width of switches of the slices (e.g., 62, 64) of the output driver 60. Any suitable control circuitry, like the power state control circuit 66, may perform the method 100. In some embodiments, the method 100 may be implemented by executing instructions stored in a tangible, non-transitory, computer-readable medium, such as the memory banks 12 or other memory, using the power state control circuit 66. While the method 100 is described using steps in a specific sequence, it should be understood that the present disclosure contemplates that the described steps may be performed in different sequences than the sequence illustrated, and certain described steps may be skipped or not performed altogether.

At block 102, the power state control circuit 66 may receive a slice configuration of the output driver 60. The slice configuration may be a value stored in a register 52 accessible by the calibration circuit 54 and/or by the power state control circuit 66. In some cases, an input received by the power state control circuit 66 indicates the slice configuration, such as an input received via an input device, via a wired or wireless coupling, from another circuit, or the like. The slice configuration may indicate a number of pull-up slices 62 and pull-down slices 64 to use in the output driver 60. Over time, the slice configuration may be changed. Thus, the slice configuration received at block 102 may be saved over or replacing a previous slice configuration. Some of the operations of the method 100 may be performed while the power state control circuit 66 uses the previous slice configuration to set up the newly received slice configuration, such as determining an additional power control signals to use to close a third set of the transistors 82 based on the slice configuration received at block 102 while a second set of the transistors 82 are opened based on the previous slice configuration.

At block 104, the power state control circuit 66 may determine power control signals to transmit to the output driver 60 based on the slice configuration. Each power control signal may close a respective transistor 82. Each of the transistors 82 may have a same or different channel width, and moreover each of the transistors 82 may have different channel widths relative to each other such that no two channel widths are the same. Thus, when determining the power control signals, the power state control circuit 66 may consider and determine which combination of the transistors 82 result in an overall, cumulative channel width that is the best match to the total or cumulative channel width of the slices closed based on the slice configuration. The power control signals may be gate control signals to be transmitted to one or more of the transistors 82 to close the subset of the transistors 82. Once closed, each closed transistor 82 may respectively transmit low supply signal (VSSQ) to the pad 70 while the qreadp_b inputs and/or the qreadn_b inputs transmit a data bit.

At block 106, the power state control circuit 66 may transmit power control signals during a data transmission operation. At block 108, the power state control circuit 66 may de-assert the power control signals to open the transistors 82 after the data bit transmission completes and the output buffer 60 is idle. While the output buffer 60 is decoupled from the low supply voltage (VSSQ) the electronic device 10, leakage currents may be reduced relative to when switches of the pull-up slices 62 and/or the pull-down slices 64 are idle but connected to the low supply voltage (VSSQ).

Figure 5:
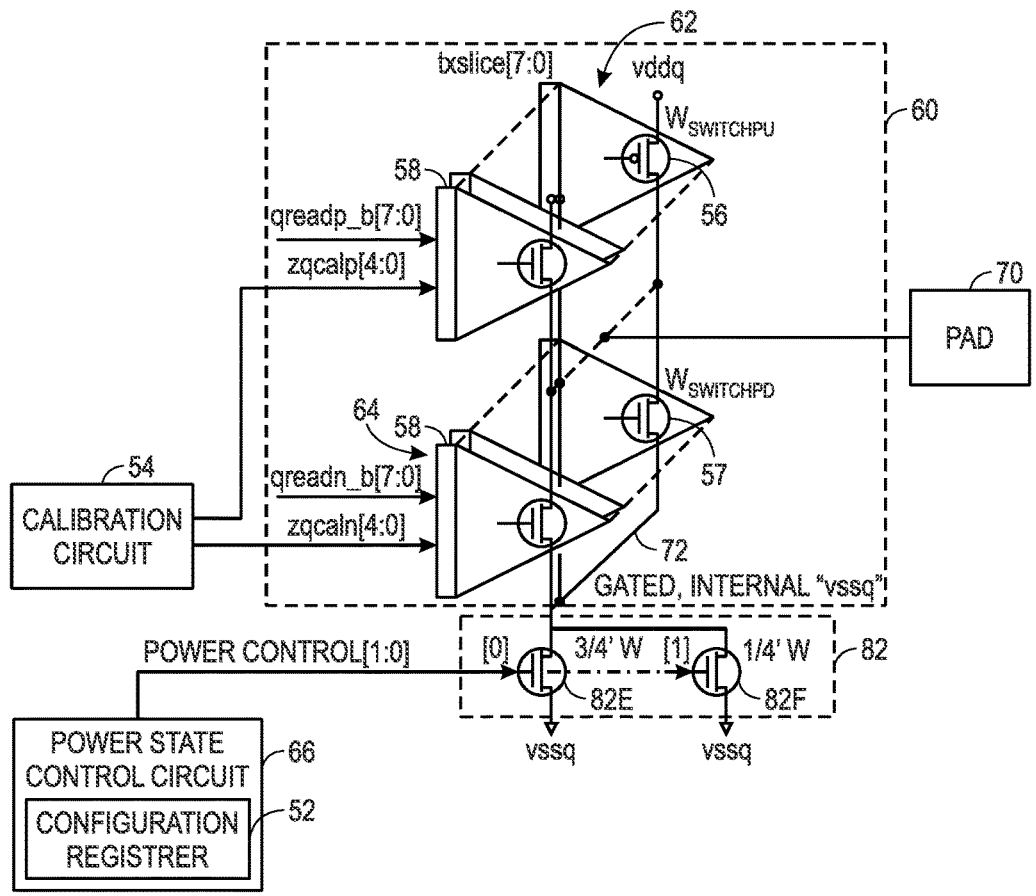
FIG. 5 is a circuit diagram of the output driver of FIG. 2 with a set of power control switches that have different widths than the set of power control switches of FIG. 3, in accordance with an embodiment.

Keeping the foregoing in mind, FIG. 5 is a circuit diagram of an example variation of the output driver 60 of FIG. 2 that includes a set of transistors 82 (transistor 82E, transistor 82F). The transistors 82 may together have a channel width equal to that of the transistor 68 of FIG. 2 and individually have smaller channel widths than that of the transistor 68. However, the transistors 82 of FIG. 5 may have different widths relative to widths of the transistors 82 of FIG. 3. For example, the transistors 82 of FIG. 5 may have a cumulative channel width equal to ¾ of the channel width of the transistor 68 (¾*Wpg) when just the transistor 82E is closed and may have a cumulative channel width equal to ¼ of the channel width of the transistor 68 (¼*Wpg) when just the transistor 82F is closed. Similar to the power control signals of FIGS. 2 and 3, the power state control circuit 66 may transmit control signals, power control[1:0], to selectively turn on one or more of the transistors 82.

Figure 6:
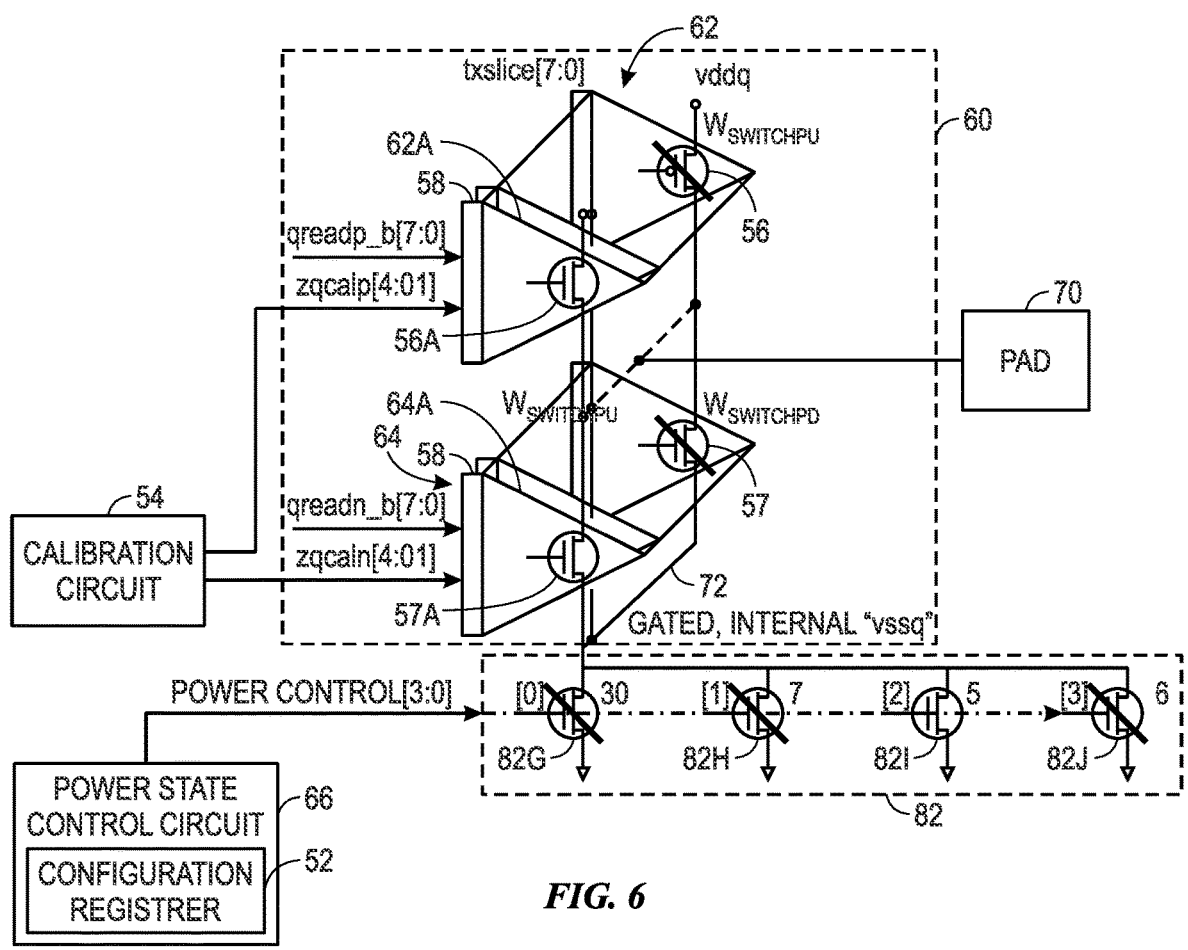
FIG. 6 is a circuit diagram of the output driver of FIG. 2 with a set of power control switches that have different widths than the set of power control switches of FIG. 3 and the set of power control switches of FIG. 5, in accordance with an embodiment.
Figure 2:
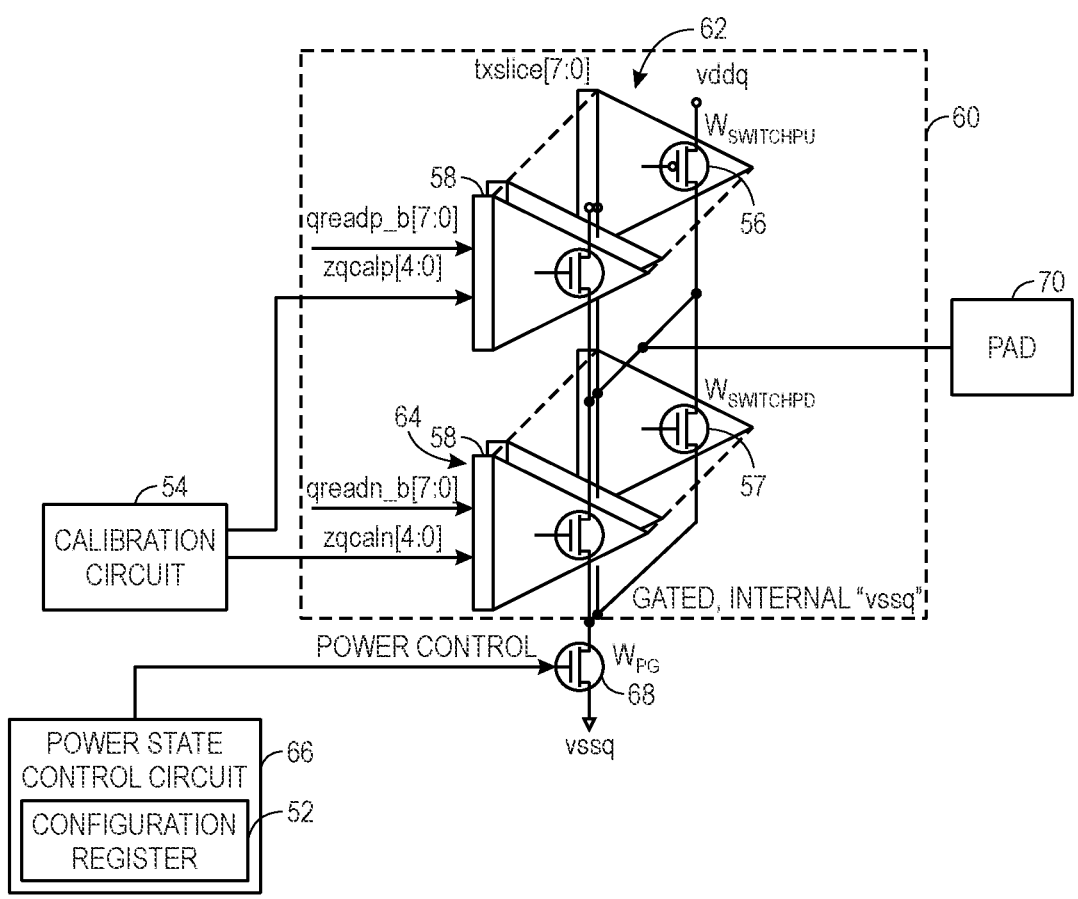
Figure 3:
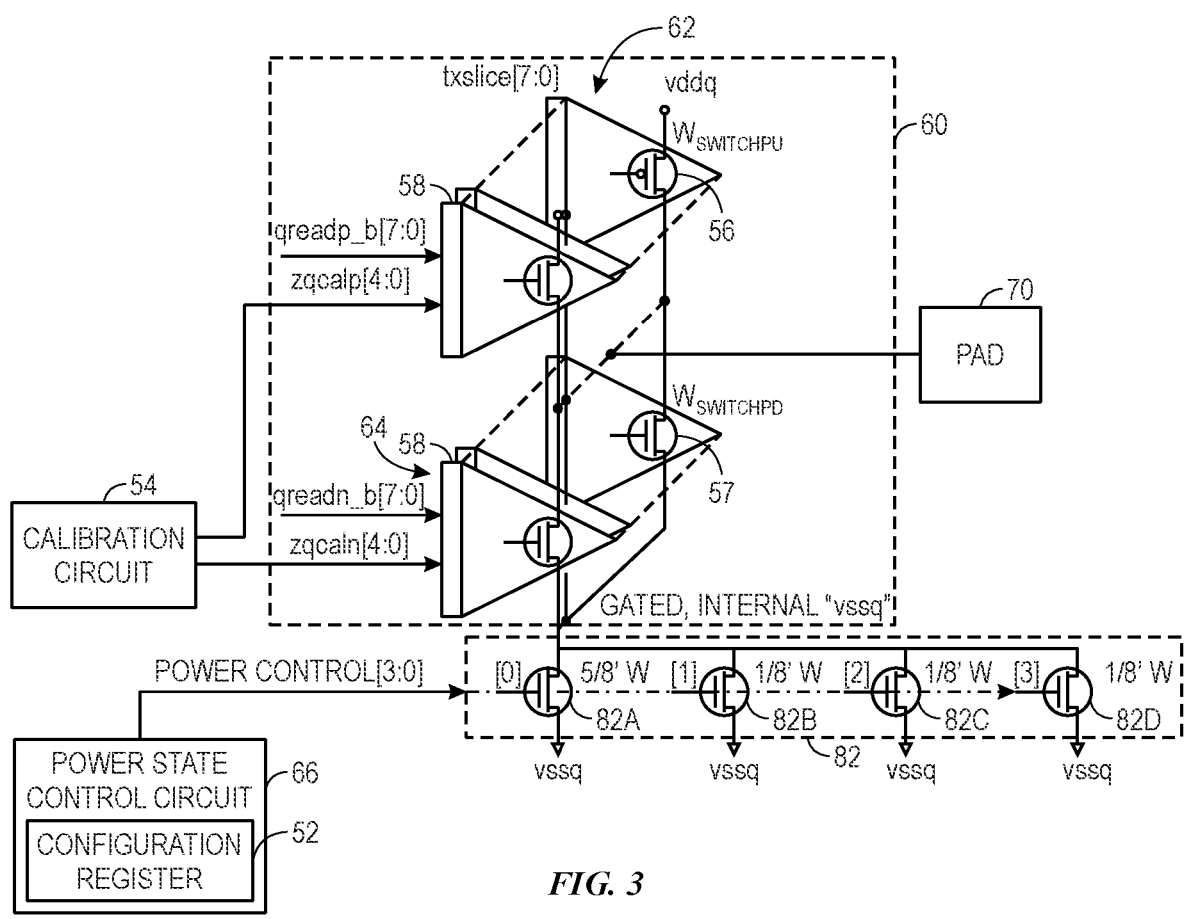
Figure 4:
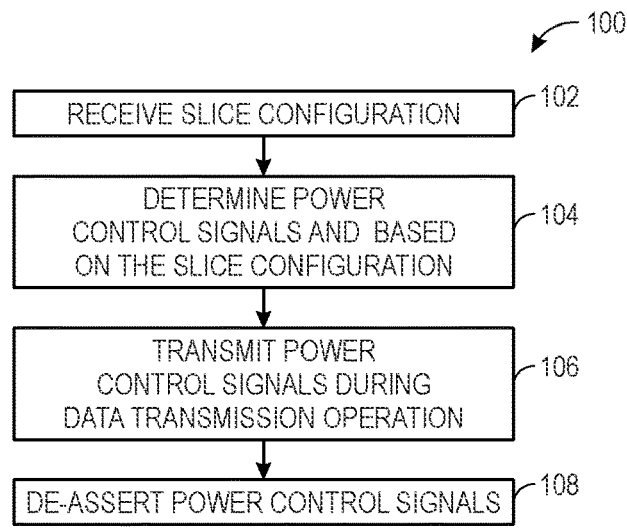
Figure 5:
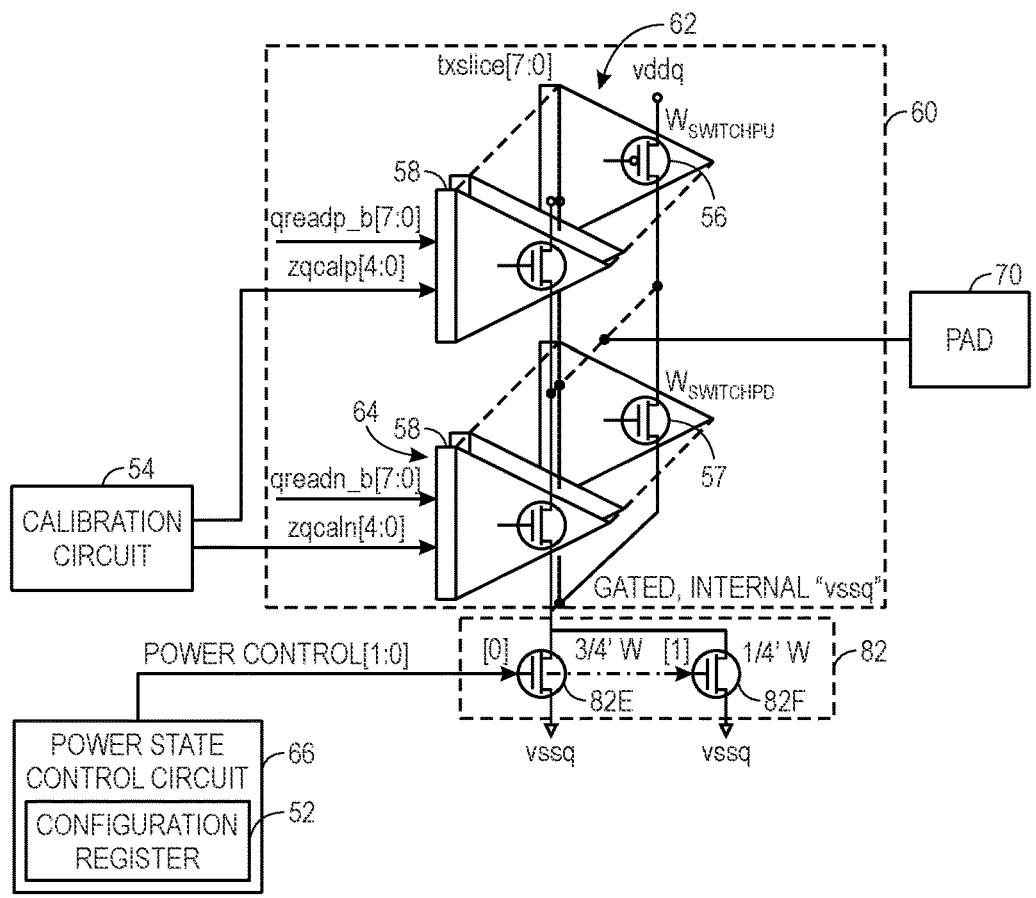
Figure 6:
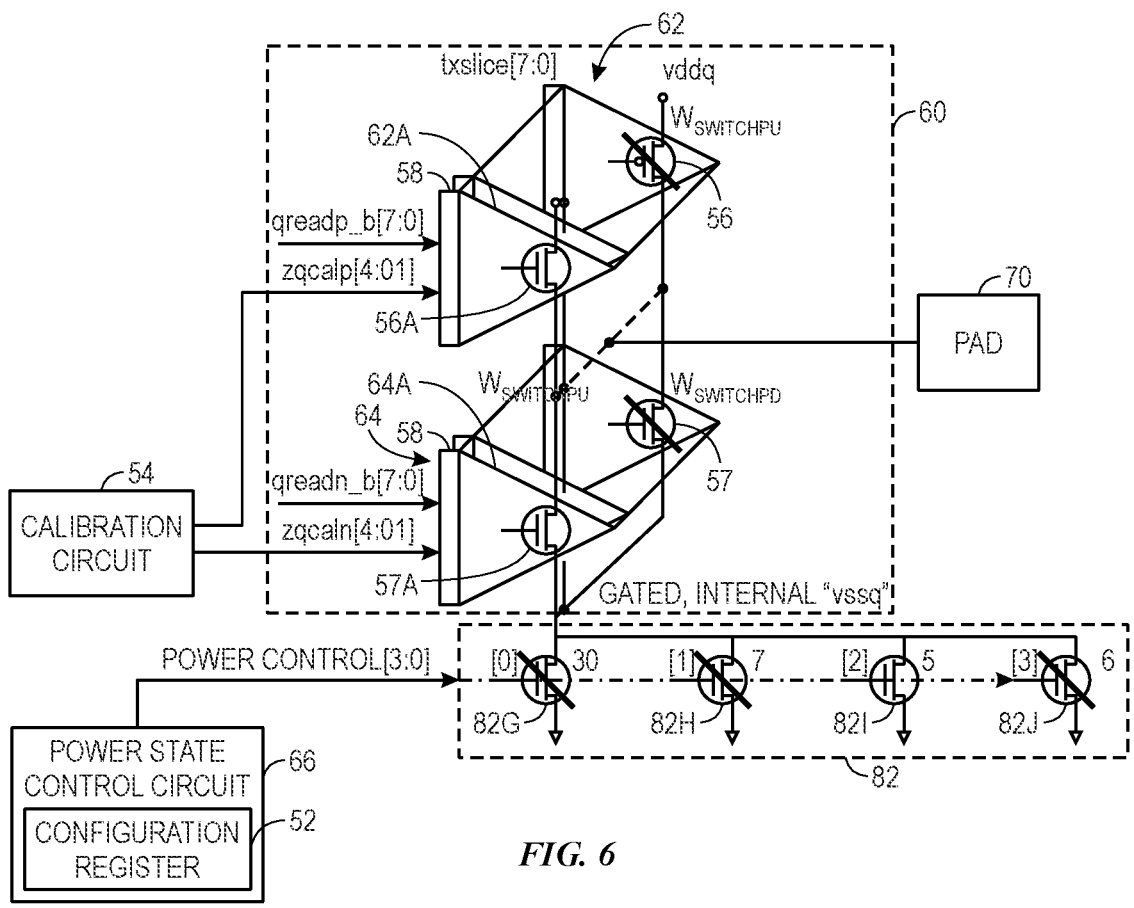

Similarly, FIG. 6 is a circuit diagram of another example variation of the output driver 60 of FIG. 2 that includes a set of transistors 82 (transistor 82G, transistor 82H, transistor 82I, transistor 82J). Some of the transistors 82 are open (e.g., represented via crossed out line) and some of the transistors 56, 57 are open (e.g., transistors 56 corresponding to pull-up slice 62A and transistors 57 corresponding to pull-down slice 64A). The transistors 82, when all are closed, together have a channel width equal to that of the transistor 68 of FIG. 2 and individually have smaller channel widths than that of the transistor 68. However, the transistors 82 of FIG. 6 has different widths than the transistors 82 of FIG. 3.

In the depicted configuration, transistor 82I is closed and the other transistors 82 (e.g., 82G, 82H, 82J) are open, creating a total channel width equal to ⅝s of the channel width of the transistor 68 (⅝s*Wpg). Other combinations of transistors 82 may be used to create different widths, as described above. For example, the transistors 82 of FIG. 5 may have a channel width equal to ³⁰⁄₄₈ of the channel width of the transistor 68 (³⁰⁄₄₈*Wpg) when just the transistor 82G is closed and may have a channel width equal to ⅞s of the channel width of the transistor 68 (⅞s*Wpg) when just the transistor 82H is on. Different combinations of the transistors 82 yield different total channel widths. Indeed, this example illustrates how transistors 82 need not be equal in channel width relative to each other (e.g., not equal ⅛*Wpg or ¼*Wpg widths). Any relative size of the transistors 82 may be used to create the channel width of the transistor 68 of FIG. 2.

In embodiment illustrated in FIG. 6, some of the transistors 82 are closed and some are open. It should be understood that in an actual implementation the respective transistors 82 that are open or closed may change. Indeed, if a single pull-down slice 64A, pull-up slice 64A pair is activated, a relatively small channel width of the transistor 57A (e.g., matching that of transistor 56A) is to be matched via the channel width of transistors 82. Thus, the power state control circuit 66 may operate each transistor 82 open except for the smallest channel width transistor 82I. Even if the channel width of the transistor 82I is not an optimal match for the channel width of the pull-down slice 64A, changes in impedance from large mismatches between channel widths of transistors 57 and channel widths of transistors 82 may be mitigated and performance still improved of the electronic device. Other combinations of closed and open transistors 57, 82 may also be used.

In some embodiments, some or each of the power control signals may be electrically coupled to one or more fuses such that a particular operational mode (e.g., a particular number of transistors 82) may be permanently fixed and/or excluded from future use. In this way, an operator of testing equipment may confirm a particular matching configuration desired to be used for a particular input pad 70 and after completion of the verification activities, the host device may respond by disabling the electrical coupling, for example, by destroying the fuse. Through burning of the fused electrical connection, a host device may be unable to electrically couple to one or more inputs of the transistors 82 to provide the power control signals. It is noted that fuses may be replaced or bypassed, or include an override or restart operation to reset a state of the fuse.

Sometimes, the power state control circuit 66 may close a number of the transistors 82 based on a ratio of channel widths. The power state control circuit 66 may determine a first ratio comparing a channel width of the closed transistors 56, 57 and a channel width across all the transistors 56, 57. The power state control circuit 66 may determine a second ratio comparing a channel width of the closed transistors 82 and a channel width across all the transistors 82. The power state control circuit 66 may open or close some of the transistors 82 to cause the second ratio to equal or similar to the first ratio. It should also be understood that, each time a channel width is discussed herein with reference to FIGS. 1-6 as equaling a particular value, a channel width may be substantially equal to or within a threshold value of the particular value (e.g., +/−1% margin, +/−2% margin).

Other applications may improve from usage of input pad matching systems and methods, such as inputs or outputs disposed outside of the memory device 10. For example, other inputs or outputs of the memory device 10 or host device may benefit from impedance matching and/or selective disconnection of other switches operating similar to the switches of the pull-up slices 62 and/or pull-down slices 64 via power control switches similar to the power control switches (e.g., 82) described herein.

Accordingly, the technical effects of the present disclosure include systems and methods for reducing output driver losses by matching channel widths of one or more closed power control switches to channel widths of close transistors in the output driver. Changing a number of transistors closed as fewer slices are used for data transmission in the output buffer may mitigate changes in impedance values of the output buffer otherwise experienced in unmatched circuits. Indeed, by reducing a cumulative channel width distributed over one or more power control switches as fewer slices of the output buffer are used, or by increasing the cumulative channel width as more slices are used, losses may be reduced and/or impedance configurations may be preserved.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a set of power control transistors having a first channel width;
an output driver configured to couple to a first supply voltage via the set of power control transistors, wherein the output driver comprises a plurality of transistors having a second channel width; and
a power state control circuit configured to:
receive an indication of the second channel width; and
configure the first channel width to equal the second channel width at least in part by closing one or more power control transistors of the set of power control transistors.

2. The device of claim 1, wherein the power state control circuit is configured to close one or more power control transistors of the set of power control transistors at least in part by:
determining the one or more power control transistors to close based at least in part on the indication of the second channel width; and closing the one or more power control transistors at least in part by transmitting one or more control signals generated in response to determining to close the one or more power control transistors.

3. The device of claim 2, wherein the power state control circuit is configured to determine the one or more power control transistors to close at least in part by reading a value stored in a register.

4. The device of claim 1, wherein the output driver comprises an additional transistor configured to be open during a data transmission via the output driver.

5. The device of claim 1, wherein each respective power control transistor of the set of power control transistors is respectively characterized by a third channel width.

6. The device of claim 1, wherein each respective power control transistor of the set of power control transistors are respectively characterized by different channel widths.

7. The device of claim 1, wherein the output driver is configured to transmit a data bit via each of the plurality of transistors.

8. The device of claim 1, wherein the output driver comprises a plurality of pull-up slices and a plurality of pull-down slices that comprise the plurality of transistors.

9. The device of claim 1, wherein the set of power control transistors comprises:
a first power control transistor having a third channel width that is three-fourths of the first channel width; and
a second power control transistor having a fourth channel width that is one-fourth of the first channel width.

10. A method, comprising:
receiving a slice configuration, wherein the slice configuration is configured to program a number of slices of an output driver used when transmitting a data bit, wherein the number of slices comprise a first plurality of transistors that close to transmit the data bit, wherein the first plurality of transistors have a first channel width;
determining a plurality of power control signals based on the slice configuration; and
transmitting the plurality of power control signals to close a second plurality of transistors, wherein the second plurality of transistors are configured to couple the first plurality of transistors to a first supply voltage, and wherein the second plurality of transistors have a second channel width equal to the first channel width.

11. The method of claim 10, wherein determining the plurality of power control signals based on the slice configuration comprises determining a number of the first plurality of transistors instructed to be turned on by the slice configuration.

12. The method of claim 10, wherein receiving the slice configuration comprises reading the slice configuration from a register.

13. The method of claim 10, comprising:
receiving an additional slice configuration; and
determining an additional plurality of power control signals configured to close a third plurality of transistors while the second plurality of transistors are opened.

14. The method of claim 10, wherein determining the plurality of power control signals based on the slice configuration comprises:
determining a total channel width characterized by the first plurality of transistors; and
determining the first subset of the second plurality of transistors from each of the second plurality of transistors based at least in part on how the first subset of the second plurality of transistors is characterized by the second channel width.

15. A memory device system, comprising:
an output driver comprising a plurality of transistors;
a plurality of power control transistors configured to couple the output driver to a first supply voltage; and
a control circuit configured to:
determine a first channel width of the plurality of transistors to match;
determine a subset of the plurality of power control transistors to turn on to form a first transmission path between the first supply voltage and the output driver, wherein the subset of the plurality of power control transistors is selected based at least in part on the first channel width; and
generate one or more power control signals configured to turn on the subset of the plurality of power control transistors.

16. The memory device system of claim 15, wherein the subset of the plurality of power control transistors are configured to have the first channel width, and wherein the plurality of power control transistors are configured to couple the output driver to the first supply voltage during a data bit transmission to an input pad.

17. The memory device system of claim 16, wherein the input pad is configured to couple to a plurality of pull-up slices and pull-down slices of the output driver.

18. The memory device system of claim 17, wherein the plurality of pull-up slices and pull-down slices comprise the plurality of transistors.

19. The memory device system of claim 15, wherein the control circuit is configured to determine the subset of the plurality of power control transistors based on the subset of the plurality of power control transistors having a second channel width equal to the first channel width.

20. The memory device system of claim 15, wherein the control circuit is configured to determine the subset of the plurality of power control transistors based on the subset of the plurality of power control transistors having a second channel width within a threshold value of to the first channel width.

* * * * *

UNITED STATES PATENT AND TRADEMARK OFFICE
CERTIFICATE OF CORRECTION

PATENT NO. : 11,750,188 B2
APPLICATION NO. : 17/460587
DATED : September 5, 2023
INVENTOR(S) : Bret Addison Johnson et al.

It is certified that error appears in the above-identified patent and that said Letters Patent is hereby corrected as shown below:

In the Specification

In Column 4, Line 19, please delete "(e.g., signals 8 from an external device" and insert --(e.g., signals 8) from an external device--, therefor.

In Column 10, Line 38, please delete "supply voltage (VSSQ) the electronic device 10" and insert --supply voltage (VSSQ) of the electronic device 10--, therefor.

In the Claims

In Column 14, Line 52, please delete "a threshold value of to the first channel width" and insert --a threshold value of the first channel width--, therefor.

Signed and Sealed this
Twelfth Day of March, 2024

Katherine Kelly Vidal
*Director of the United States Patent and Trademark Office*